US008198010B2

(12) United States Patent
Rondon et al.

(10) Patent No.: US 8,198,010 B2
(45) Date of Patent: *Jun. 12, 2012

(54) LITHOGRAPHIC IMAGING WITH PRINTING MEMBERS HAVING HYDROPHILIC, SURFACTANT-CONTAINING TOP LAYERS

(75) Inventors: Sonia Rondon, Nashua, NH (US); Susan Lanphear, Henniker, NH (US)

(73) Assignee: Presstek, Inc., Hudson, NH (US)

(*) Notice: Subject to any disclaimer, the term of this patent is extended or adjusted under 35 U.S.C. 154(b) by 165 days.

This patent is subject to a terminal disclaimer.

(21) Appl. No.: 11/937,869

(22) Filed: Nov. 9, 2007

(65) Prior Publication Data

US 2009/0123871 A1 May 14, 2009

(51) Int. Cl.
*G03F 7/00* (2006.01)
*G03F 7/26* (2006.01)
*B41N 1/00* (2006.01)

(52) U.S. Cl. .................. 430/302; 430/270.1; 101/450.1; 101/453; 101/463.1

(58) Field of Classification Search ............... 430/270.1, 430/302; 101/467
See application file for complete search history.

(56) References Cited

U.S. PATENT DOCUMENTS 5,783,364 A 7/1998 Ellis et al.
5,786,129 A 7/1998 Ellis
5,932,355 A * 8/1999 Iqbal et al. ................... 428/32.1
6,374,738 B1 * 4/2002 Lewis et al. ................... 101/467
6,490,975 B1 * 12/2002 Rorke et al. .................. 101/467
6,716,566 B2 4/2004 Aoshima et al.
6,808,857 B2 10/2004 Miyamoto et al.
7,078,152 B2 * 7/2006 Rondon et al. ............. 430/271.1
2003/0073032 A1 * 4/2003 Aoshima .................... 430/271.1
2003/0099902 A1 * 5/2003 Hoshi et al. ................ 430/270.1
2003/0228540 A1 * 12/2003 Goto et al. ................. 430/272.1
2004/0035310 A1 2/2004 Zindl
2004/0035645 A1 2/2004 Orrmann
2004/0035686 A1 2/2004 Allen et al.
2004/0035687 A1 2/2004 von Behrens et al.
2004/0038152 A1 * 2/2004 Goodin et al. ................ 430/302
2005/0037280 A1 2/2005 Loccufier et al.
2005/0175942 A1 * 8/2005 Ohnishi ........................ 430/434
2005/0250048 A1 11/2005 Rondon et al.
2005/0263022 A1 * 12/2005 Cassidy ........................ 101/467
2006/0019190 A1 1/2006 Damme et al.
2006/0019191 A1 1/2006 Loccufier et al.
2006/0060096 A1 3/2006 Loccufier et al.
2006/0144269 A1 7/2006 Groenendaal et al.
(Continued)

FOREIGN PATENT DOCUMENTS

EP 0830940 3/1998
(Continued)

OTHER PUBLICATIONS

International Search Report for PCT/US2008/082744, mailed on Mar. 24, 2009.

*Primary Examiner* — Cynthia Kelly
*Assistant Examiner* — Chanceity Robinson
(74) *Attorney, Agent, or Firm* — Bingham McCutchen LLP

(57) ABSTRACT

Printing members that include a topmost layer comprising a polymer and a silicone surfactant are durable and enable use of low imaging-power densities. The protective layer may contain an inorganic crosslinker.

21 Claims, 4 Drawing Sheets

U.S. PATENT DOCUMENTS

2006/0234162 A1 10/2006 Rondon

FOREIGN PATENT DOCUMENTS

| | | | | |
|---|---|---|---|---|
| EP | 1151858 | | | 11/2001 |
| EP | 1241003 | | | 9/2002 |
| EP | 1304220 | | | 4/2003 |
| EP | 1506858 | A2 | | 2/2005 |
| WO | WO-94/18005 | | | 8/1994 |
| WO | WO-98/50231 | | | 11/1998 |
| WO | WO-2005/108075 | | | 11/2005 |
| WO | WO 2005108075 | A1 | * | 11/2005 |
| WO | WO-2005108076 | | | 11/2005 |
| WO | WO-2006130241 | | | 12/2006 |

* cited by examiner

LITHOGRAPHIC IMAGING WITH PRINTING MEMBERS HAVING HYDROPHILIC, SURFACTANT-CONTAINING TOP LAYERS

BACKGROUND OF THE INVENTION

In offset lithography, a printable image is present on a printing member as a pattern of ink-accepting (oleophilic) and ink-rejecting (oleophobic) surface areas. Once applied to these areas, ink can be efficiently transferred to a recording medium in the imagewise pattern with substantial fidelity. In a wet lithographic system, the non-image areas are hydrophilic, and the necessary ink-repellency is provided by an initial application of a dampening fluid to the plate prior to inking. The dampening fluid prevents ink from adhering to the non-image areas, but does not affect the oleophilic character of the image areas. Ink applied uniformly to the wetted printing member is transferred to the recording medium only in the imagewise pattern. Typically, the printing member first makes contact with a compliant intermediate surface called a blanket cylinder which, in turn, applies the image to the paper or other recording medium. In typical sheet-fed press systems, the recording medium is pinned to an impression cylinder, which brings it into contact with the blanket cylinder.

To circumvent the cumbersome photographic development, plate-mounting, and plate-registration operations that typify traditional printing technologies, practitioners have developed electronic alternatives that store the imagewise pattern in digital form and impress the pattern directly onto the plate. Plate-imaging devices amenable to computer control include various forms of lasers.

Current laser-based lithographic systems generally rely on removal of an energy-absorbing layer from the lithographic plate to create an image. Exposure to laser radiation may, for example, cause ablation—i.e., catastrophic overheating—of the ablated layer in order to facilitate its removal. Accordingly, the laser pulse must transfer substantial energy to the absorbing layer. This means that even low-power lasers must be capable of very rapid response times, and imaging speeds (i.e., the laser pulse rate) must not be so fast as to preclude the requisite energy delivery by each imaging pulse. In addition, existing printing members often require a post-imaging processing step to remove debris generated during the imaging process. Moreover, even printing members that do not require post-imaging processing, i.e., "process-free" members, are often costly to produce. This is a particular concern for low and medium run-length applications, in which the cost of the printing members is a significant fraction of the total cost.

As explained in U.S. Pat. No. 7,078,152 and U.S. patent application Ser. No. 11/401,568, the entire disclosures of which are hereby incorporated by reference, existing printing members often utilize ceramic-based imaging layers. Such layers require a large amount of laser power to ablate because of the material properties of the ceramic, e.g., low thermal conductivity, extremely high melting point, etc. Moreover, ceramic-based imaging layers are often expensive to produce, as ceramic sputtering targets are costly and throughputs for fabrication processes such as magnetron sputtering are low. However, for many applications, ceramic-based imaging layers are utilized due to their superior mechanical characteristics, e.g., resistance to wear. Thus, there is a need to enhance the durability of inexpensive printing members suitable for low to medium run-length applications (i.e., approximately 5,000 to approximately 20,000 impressions), as well as to reduce the laser energy required for their production.

Moreover, conventional printing members can be vulnerable to scratching and other damage, and may also exhibit durability limitations. This is often due to deficiencies in the mechanical strength of the topmost layer, which experiences most directly the stresses of handling and contact with press cylinders during printing. In particular, although the various cylinders of a printing press are typically all geared so that they are driven in unison by a single drive motor, some slippage among cylinders is common, and printing members can therefore experience considerable frictional forces during use.

SUMMARY OF THE INVENTION

Embodiments of the present invention involve printing members that include a durable, surfactant-bearing, polymeric top layer, an imaging layer, and a substrate. In some embodiments, the imaging layer is responsive to low imaging-power densities. Printing members in accordance with the invention can be used on-press immediately after being imaged without the need for a post-imaging processing step. In a first aspect, the invention involves a lithographic printing member that includes a topmost polymeric layer including a silicone-based surfactant, an imaging layer that ablatively absorbs imaging radiation, and a second layer there beneath. The topmost layer and the second layer exhibit opposite affinities for at least one of ink or a liquid to which ink does not adhere. The second layer may be the substrate of the printing member or an intermediate layer that survives the imaging process. In preferred embodiments, the topmost layer is hydrophilic and the substrate, or other ink-receiving layer (e.g., the second layer), is oleophilic.

In general, the imaging layer is consumed and does not participate in printing. It may include or consist essentially of a metal, such as titanium. In various embodiments, the imaging layer includes at least one ceramic layer and at least one metal layer.

The topmost layer desirably includes a silicone surfactant. As used herein, the term "silicone" refers to polydiorganosiloxane polymers. As is understood in the art, the siloxane backbone may contain organic functional groups that impart desired properties. In general, silicones exhibit low surface energies and are both oleophobic and hydrophobic. As a result, they tend to be used, if at all, sparingly as surfactants in lithographic applications, which generally depend on an affinity difference for ink (in dry systems) or for a fluid that rejects ink (in wet systems). It has been found, however, that silicones having polar substituents, such as polyethers, can be used at high concentrations—e.g., ranging from approximately 5% to approximately 25%—in lithographically active layers without compromising their hydrophilic behavior. At this level, the surfactant is plentiful enough at the surface of the printing member to provide a useful level of lubrication. In various embodiments, the molecular weight of the surfactant ranges from approximately 2,000 to approximately 30,000 g/mol.

The topmost layer may also include an inorganic crosslinker, rather than an organic crosslinking agent (e.g., an aldehyde) that can generate volatile organic compound (VOC) emissions during the thermal decomposition that results from imaging. In various embodiments, the inorganic crosslinker includes ammonium zirconium carbonate, and the concentration of the inorganic crosslinker ranges from approximately 10% to approximately 20% to ensure a high degree of crosslinking. The top surface of the topmost layer may be substantially free of the inorganic crosslinker.

Preferred embodiments include a topmost layer based on a hydrophilic polymer, such as polyvinyl alcohol. The higher the degree of crosslinking of the polymer, the better will be the water resistance of the topmost layer to degradation by aqueous printing fluids. A low concentration of inorganic crosslinker at the surface of the topmost layer is desirable to limit the effect of the crosslinker on water receptivity, while a relatively high concentration of surfactant is desirable to promote lubrication (or "slip effect"). Accordingly, the polymer is desirably dried and cured at relatively high temperature (e.g., 350-375° F. or 175-190° C. in the case of polyvinyl alcohol). This not only ensures relatively complete crosslinking, but also encourages oxidation of the polyether groups in the silicone surfactant. The oxidized groups, in turn, can become reaction sites that form covalent or hydrogen bonds to the polyvinyl alcohol matrix, causing a portion of the surfactant to become an integral part of the coating that will remain bound at the surface (where it is needed to promote lubrication) and will not leach when exposed to the humid conditions of a typical wet-press environment. The reduced mobility of the surfactant—a well-known problem associated with silicone surfactants generally—ensures the durability of lubrication properties.

Suitable materials for the substrate include polymers (e.g., polyesters, such as polyethylene terephthalate and polyethylene naphthalate, polycarbonates, polyurethane, acrylic polymers, polyamide polymers, phenolic polymers, polysulfones, polystyrene, and cellulose acetate).

A transition layer may be disposed between and in contact with the substrate and the imaging layer. The transition layer may include a polymer, such as an acrylate polymer.

In another aspect, the invention involves a method of imaging the lithographic printing member described above. The printing member is exposed to imaging radiation in an imagewise pattern, which causes ablation of the imaging layer exposed to the radiation. At least portions of the imaging layer that received radiation are removed to create an imagewise lithographic pattern on the printing member. In particular, the imaging layer absorbs the imaging radiation and generates heat that diffuses rapidly to the interfacial areas. The heat triggers physical and chemical processes that result in removal of the imaging layer. The plate construction displays good compatibility with low power imaging sources. In some embodiments, ink is disposed on at least a portion of the printing member and transferred in the imagewise lithographic pattern to a recording medium. These steps may be repeated multiple times, e.g., approximately 5,000 to approximately 20,000 times.

In another aspect, the invention involves a method of forming the lithographic printing member described above. Forming the topmost layer may include disposing a topmost layer formulation over the imaging layer and curing the topmost layer formulation (e.g., by heating it to a temperature ranging from approximately 350° F. or 175° C. to approximately 375° F. or 190° C.). Curing the topmost layer formulation may include reacting at least a portion of the silicone surfactant with the polymer such that the portion of the silicone surfactant becomes an integral part of the topmost layer. In an embodiment, the topmost layer formulation includes an inorganic crosslinker, although effective organic crosslinkers known in the art, such as glyoxal, are also suitable. Curing may include reacting the polymer and the inorganic crosslinker such that the topmost layer is approximately completely crosslinked.

It should be stressed that, as used herein, the term "plate" or "member" refers to any type of printing member or surface capable of recording an image defined by regions exhibiting differential affinities for ink and/or fountain solution. Suitable configurations include the traditional planar or curved lithographic plates that are mounted on the plate cylinder of a printing press, but can also include seamless cylinders (e.g., the roll surface of a plate cylinder), an endless belt, or other arrangement.

Furthermore, the term "hydrophilic" is used in the printing sense to connote a surface affinity for a fluid which prevents ink from adhering thereto. Such fluids include water for conventional ink systems, aqueous and non-aqueous dampening liquids, and the non-ink phase of single-fluid ink systems. Thus, a hydrophilic surface in accordance herewith exhibits preferential affinity for any of these materials relative to oil-based materials.

DESCRIPTION OF THE PREFERRED EMBODIMENTS

1. Imaging Apparatus

Figure 1:
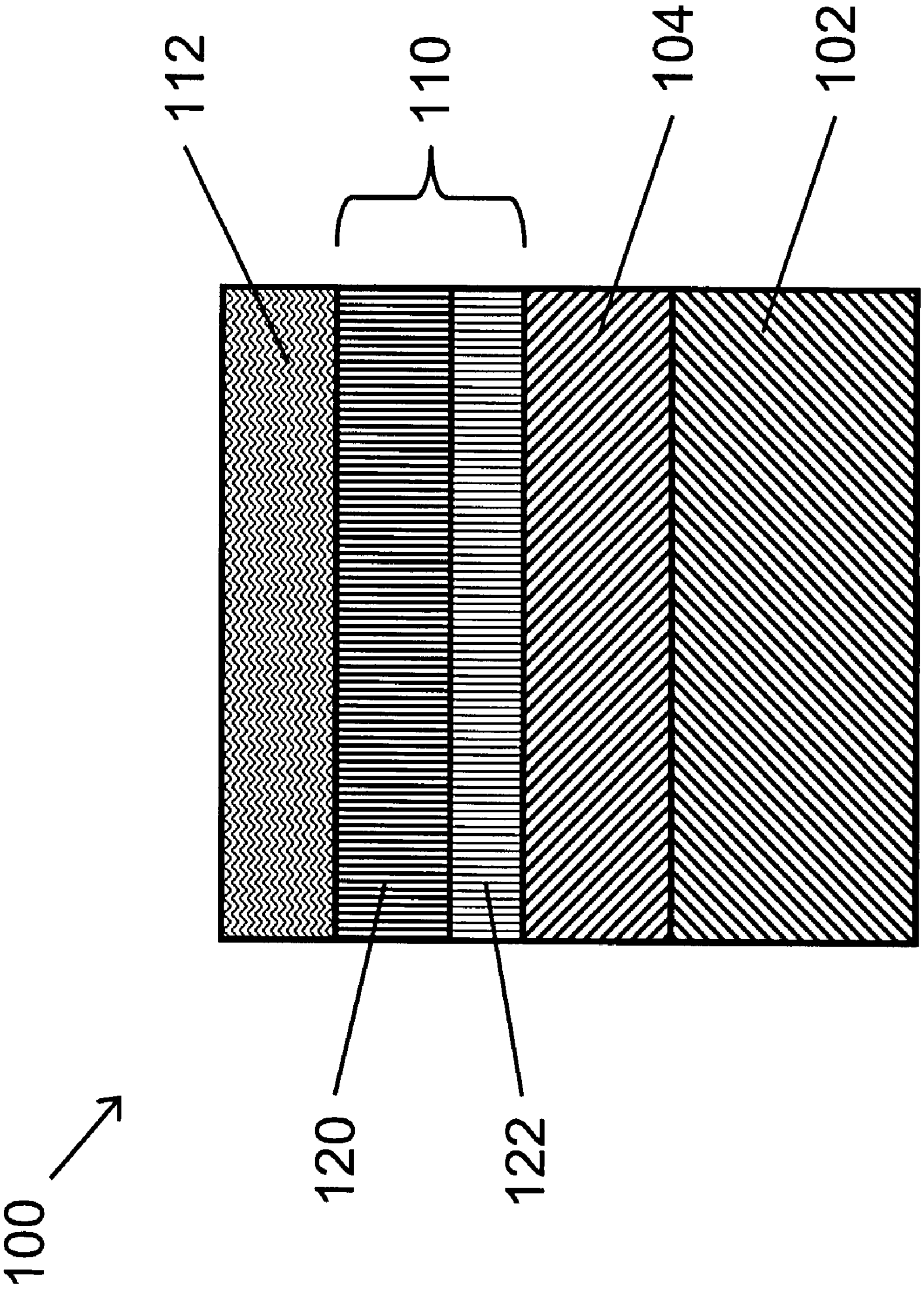
FIG. 1 is an enlarged cross-sectional view of a negative-working printing member according to the invention that includes a substrate, a transition layer, a multi-layer imaging layer, and a topmost layer.

An imaging apparatus suitable for use in conjunction with the present printing members includes at least one laser device that emits in the region of maximum plate responsiveness, i.e., whose $\lambda_{max}$ closely approximates the wavelength region where the plate absorbs most strongly. Specifications for lasers that emit in the near-IR region are fully described in U.S. Pat. No. Re. 35,512 ("the '512 patent") and U.S. Pat. No. 5,385,092 ("the '092 patent"), the entire disclosures of which are hereby incorporated by reference. Lasers emitting in other regions of the electromagnetic spectrum are well-known to those skilled in the art.

Suitable imaging configurations are also set forth in detail in the '512 and '092 patents. Briefly, laser output can be provided directly to the plate surface via lenses or other beam-guiding components, or transmitted to the surface of a blank printing plate from a remotely sited laser using a fiber-optic cable. A controller and associated positioning hardware maintain the beam output at a precise orientation with respect to the plate surface, scan the output over the surface, and activate the laser at positions adjacent selected points or areas of the plate. The controller responds to incoming image signals corresponding to the original document or picture being copied onto the plate to produce a precise negative or positive image of that original. The image signals are stored as a bitmap data file on a computer. Such files may be generated by a raster image processor ("RIP") or other suitable means. For example, a RIP can accept input data in page-description language, which defines all of the features required to be transferred onto the printing plate, or as a combination of page-description language and one or more image data files. The bitmaps are constructed to define the hue of the color as well as screen frequencies and angles.

Other imaging systems, such as those involving light valving and similar arrangements, can also be employed; see, e.g., U.S. Pat. Nos. 4,577,932; 5,517,359; 5,802,034; and 5,861, 992, the entire disclosures of which are hereby incorporated by reference. Moreover, it should also be noted that image spots may be applied in an adjacent or in an overlapping fashion.

The imaging apparatus can operate on its own, functioning solely as a platemaker, or can be incorporated directly into a lithographic printing press. In the latter case, printing may commence immediately after application of the image to a blank plate, thereby reducing press set-up time considerably. The imaging apparatus can be configured as a flatbed recorder or as a drum recorder, with the lithographic plate blank mounted to the interior or exterior cylindrical surface of the drum. Obviously, the exterior drum design is more appropriate to use in situ, on a lithographic press, in which case the print cylinder itself constitutes the drum component of the recorder or plotter.

In the drum configuration, the requisite relative motion between the laser beam and the plate is achieved by rotating the drum (and the plate mounted thereon) about its axis and moving the beam parallel to the rotation axis, thereby scanning the plate circumferentially so the image "grows" in the axial direction. Alternatively, the beam can move parallel to the drum axis and, after each pass across the plate, increment angularly so that the image on the plate "grows" circumferentially. In both cases, after a complete scan by the beam, an image corresponding (positively or negatively) to the original document or picture will have been applied to the surface of the plate.

In the flatbed configuration, the beam is drawn across either axis of the plate, and is indexed along the other axis after each pass. Of course, the requisite relative motion between the beam and the plate may be produced by movement of the plate rather than (or in addition to) movement of the beam.

Regardless of the manner in which the beam is scanned, in an array-type system for on-press applications it is generally preferable to employ a plurality of lasers and guide their outputs to a single writing array. The writing array is then indexed, after completion of each pass across or along the plate, a distance determined by the number of beams emanating from the array, and by the desired resolution (i.e., the number of image points per unit length). Off-press applications, which can be designed to accommodate very rapid scanning (e.g., through use of high-speed motors, mirrors, etc.) and thereby utilize high laser pulse rates, can frequently utilize a single laser as an imaging source.

2. Lithographic Printing Members

The metal, ceramic, and plasma polymer films used in the present invention may be applied using a planar magnetron source plasma with metal or ceramic targets as the electrode. The process can be performed using direct (DC) current or alternating current sources (i.e., AC and RF). Suitable configurations for planar magnetron sputtering are well-known in the art of vacuum coating; see, e.g., Vossen & Kern, "Thin Film Processes," Academic Press (1978). The sputtering deposition process may be carried out in sequence in the same vacuum system after deposition of the plasma polymer layer. Therefore, the base pressure of the system is desirably kept in the range of $10^{-5}$ to $10^{-6}$ Torr. This low pressure reduces the amount of water and other contaminants that could affect the properties of the ceramic imaging layer. For example, reduction or elimination of oxygen in the deposition system can be important because oxygen may react with the metal species during the magnetron deposition process, resulting in highly oxidized films with degraded optical, thermal, and mechanical properties. The magnetron-sputtering deposition process is typically carried out using argon as sputtering gas that bring the total system pressures to values on the order of 1-3 mTorr.

All films used in the present invention are preferably continuous. The term "continuous" as used herein means that the surface of the substrate is completely covered with a uniform layer of the deposited material.

FIG. 1 illustrates a negative-working printing member 100 according to the invention that includes a substrate 102, an optional hardcoat transition layer 104, a multi-layer imaging layer 110 and a topmost layer 112. Multi-layer imaging layer 110 includes at least one metal layer 120 and at least one ceramic layer 122. While only one pair of layers 120, 122 is shown, multi-layer imaging layer 110 may include multiple layers 120 and/or 122, in any order or mutual orientation. In preferred embodiments, layer 110 is infrared (IR) sensitive, and imaging of the printing member 100 (by exposure to IR radiation) results in ablation of layer 110. The resulting de-anchorage of topmost layer 112 facilitates its removal by rubbing or simply as a result of contact during the print "make ready" process. Layer 102 and/or 104 exhibits a lithographic affinity opposite that of topmost layer 112. Consequently, ablation of imaging layer 110, followed by imagewise removal of the topmost layer 112 to reveal the underlying transition layer 104 or the substrate 102, results in a lithographic image.

Figure 2:
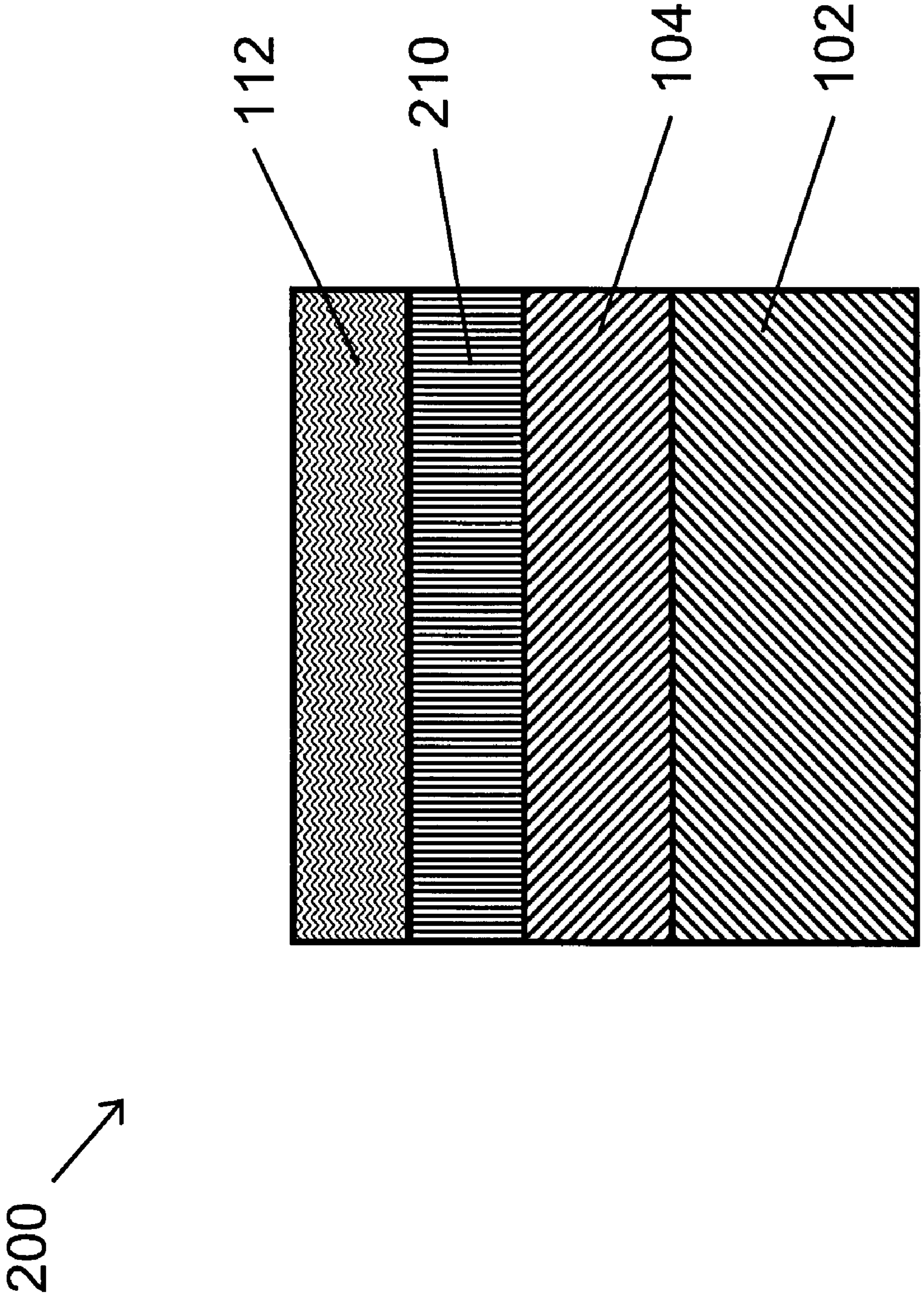
FIG. 2 is an enlarged cross-sectional view of a negative-working printing member according to the invention that includes a substrate, a transition layer, an imaging layer, and a topmost layer.
Figure 3:
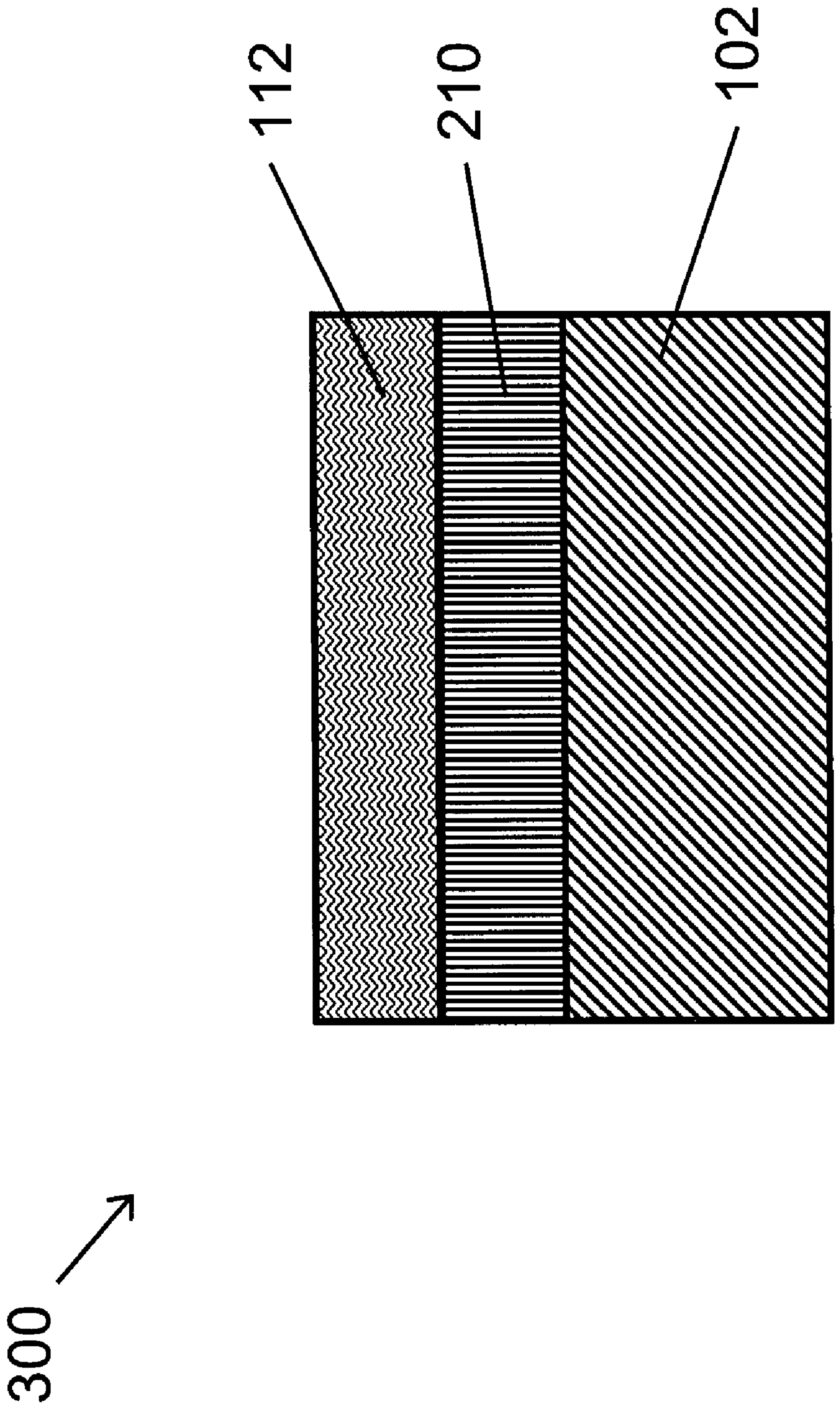
FIG. 3 is an enlarged cross-sectional view of a negative-working printing member according to the invention that includes a substrate, an imaging layer, and a topmost layer.

FIG. 2 illustrates a variation of the embodiment illustrated in FIG. 1, in which printing member 200 includes a single metal imaging layer 210 rather than multi-layer imaging layer 110. FIG. 3 illustrates a further variation that includes imaging layer 210 and omits hardcoat transition layer 104. Each of these layers and their functions will be described in detail below.

a. Substrate 102

The substrate provides dimensionally stable mechanical support to the printing member. The substrate should be strong, stable, and flexible. One or more surfaces (and, in some cases, bulk components) of the substrate may be hydrophilic. The topmost surface, however, is generally oleophilic. Suitable substrate materials include, but are not limited to, metals, polymers, and paper.

Polymers suitable for use in substrates according to the invention include, but are not limited to, polyesters (e.g., polyethylene terephthalate and polyethylene naphthalate), polycarbonates, polyurethane, acrylic polymers, polyamide polymers, phenolic polymers, polysulfones, polystyrene, and cellulose acetate. A preferred polymeric substrate is polyethylene terephthalate film, such as the polyester films available from E. I. duPont de Nemours Co. (Wilmington, Del.) under the trademarks of MYLAR and MELINEX, for example.

Polymeric substrates can be coated with a hard polymer transition layer to improve the mechanical strength and durability of the substrate and/or to alter the hydrophilicity or oleophilicity of the surface of the substrate. Ultraviolet or electron-beam cured acrylate coatings, for example, are suitable for this purpose. The addition of fillers such as, for example, silica particles, also enhances the mechanical properties of the transition layer. Examples of suitable materials for hard transition layers according to the invention include hard coat materials with silica loadings below three percent, e.g., those supplied by QureTech (Seabrook, N.H.). Other suitable oleophilic coating formulations and application techniques for transition layers are described below and disclosed, for example, in U.S. Pat. No. 5,339,737, the entire disclosure of which is hereby incorporated by reference.

Polymeric substrates can have thicknesses ranging from about 50 μm to about 500 μm or more, depending on the specific printing member application. For printing members in the form of rolls, thicknesses of about 200 μm are preferred. For printing members that include transition layers, polymer substrates having thicknesses of about 50 μm to about 100 μm are preferred.

A wide variety of papers may be utilized as a substrate. Typically, papers are saturated with a polymeric treatment to improve dimensional stability, water resistance, and strength during the wet lithographic printing.

b. Transition Layer (hard coat) 104

The transition layer serves to relieve stress between a relatively soft polymer substrate and the harder layers above; it is typically used when the polymer lacks suitable mechanical properties to act as a durable substrate. The transition layer generally is a hard organic polymer coating selected on the basis of specific mechanical properties, such as hardness and Young's modulus. The transition layer also should exhibit good adherence to the substrate and overlying layers. Preferred materials include hard polymer coatings based on thermal, UV, or e-beam cured acrylate monomers and oligomers. Filler materials, such as silica and/or titanium oxide, may be included in the transition layer to improve the mechanical properties of the coatings. Examples of commercially available oleophilic materials suitable for use in transition layers include MARNOT and TERRAPIN coatings sold by Tecra Corporation (New Berlin, Wis.), and hard coats supplied by QureTech (Seabrook, N.H.).

The transition layer can be applied to the substrate using any suitable coating technique known in the art. For example, the transition layer polymer can be dissolved or suspended in a solvent, applied to the substrate using a wire-wound rod, and dried and cured to form a uniform transition layer. The transition layer is generally applied to a thickness of about 1 μm to about 4 μm.

c. Imaging Layer 110, 210

The imaging layer absorbs imaging radiation and is at least partially ablated, thus capturing the image on the printing member. The imaging layer can be hydrophilic or oleophilic, but if it survives ablation to any degree, it will generally exhibit a lithographic affinity opposite that of topmost layer 112. The imaging layer should be hard yet flexible, and highly wear-resistant. In addition, materials utilized in this layer should form a strong bond to surrounding layers, but the bond should be easily weakened during laser ablation. Suitable materials for the imaging layer include, but are not limited to, ceramics (e.g., ceramic layer 122 in multi-layer imaging layer 110), metals (e.g., metal layer 120 in multi-layer imaging layer 110), metal oxides, and polymers.

Ceramics include refractory oxides, carbides, and nitrides of metals and non-metals. Suitable ceramic materials include, but are not limited to, interstitial carbides (e.g., TiC, ZrC, HfC, VC, NbC, TaC, $Cr_3C$, $Mo_2C$, and WC), covalent carbides (e.g., $B_4C$ and SiC), interstitial nitrides (e.g., TiN, ZrN, HfN, VN, NbN, TaN, BN, and $Si_3N_4$), metal oxides (e.g., TiO, $TiO_2$, BeO, MgO, and $ZrO_2$), carbonitrides, oxynitrides, oxycarbides, as well as combinations thereof. Other suitable ceramic materials are straightforwardly identified by those of skill in the art, e.g., by reference to Pierson, "Handbook of Refractory Carbides and Nitrides" (1996, William Andrew Publishing, N.Y.). Ceramic imaging layers may also include dopants, such as copper, for example.

Ceramic imaging layers can be deposited using any vacuum deposition technique known in the art suitable for deposition of inorganic compounds. Magnetron sputtering deposition, once again, is a preferred technique because of the well-known advantages for coating of large-area substrates. Selection of optimum deposition conditions for films with selected atomic composition is well within the skill of practitioners in the art. Ceramic imaging layers are generally applied at extremely low thicknesses ranging from about 3 nm to about 15 nm.

The ceramic sputtering deposition process is desirably carried out in sequence in the same vacuum system after deposition of the other layers of the plate construction. The base pressure of the vacuum system is kept at values on the order of $10^{-5}$ Torr for all the deposition processes. This low pressure reduces the amount of water and other contaminants that could affect the properties of the ceramic imaging layer. For example, reduction or elimination of oxygen in the deposition system is desirable because oxygen can react with the metal species during magnetron deposition process, leading to the deposition of non-stoichiometric ceramic films with degraded optical, thermal, and mechanical properties. The magnetron sputtering deposition processes are typically carried out using flows argon or gas mixtures that bring the total pressures to values on the order of 1-3 mTorr.

Suitable metals for the imaging layer include, but are not limited to, titanium, aluminum, zinc, chromium, vanadium, zirconium, and alloys thereof. Metal imaging layers are preferably thin (but thicker than the ultra-thin ceramic layer), e.g., about 20 nm to about 40 nm, to optimize the near-IR-absorption properties of the imaging layer, thereby concentrating heat within the region of the imaging pulse so as to effect image transfer at minimal imaging power. While metals have the optical and thermal properties required for the imaging mechanism described herein, they may lack the mechanical and tribological characteristics required for structures that capable of enduring the wear conditions imposed by a printing press. Accordingly, if metals are to be used as a major component of the imaging layer, they are desirably combined with a durable topcoat layer and/or hard ceramic material or layer.

Polymers suitable for use in imaging layers according to the invention may inherently IR-absorbing (e.g., polypyrroles) or may contain one or more IR-absorbing additives dispersed therein. Suitable polymers include, but are not limited to, vinyl-type polymers (e.g., polyvinyl alcohol) polyurethanes, cellulosic polymers (e.g., nitrocellulose), polycyanoacrylates, and epoxy polymers. The imaging layers may also be formed from a combination of one or more polymers, such as nitrocellulose in combination with a vinyl-type polymer.

Suitable IR-absorbing materials include a wide range of dyes and pigments, such as carbon black (e.g., CAB-O-JET 200, sold by Cabot Corporation, Bedford, Mass., and BONJET BLACK CW-1, sold by Orient Corporation, Springfield, N.J.), nigrosine-based dyes, phthalocyanines (e.g., aluminum phthalocyanine chloride, titanium oxide phthalocyanine, vanadium (IV) oxide phthalocyanine, and the soluble phthalocyanines supplied by Aldrich Chemical Co., Milwaukee, Wis.), naphthalocyanines, iron chelates, nickel chelates, oxoindolizines, iminium salts, and indophenols, for example. Any of these materials may be dispersed in a prepolymer before cross-linking into a final film. Alternatively, the absorber may be a chromophore chemically integral with the polymer backbone; see, e.g., U.S. Pat. No. 5,310,869. Polymeric imaging layers can include other additives known in the art, including, for example, cross-linking agents.

Polymeric imaging layers can be applied using any coating technique known in the art such as wire-wound rod coating, reverse roll coating, gravure coating, or slot die coating, for example.

d. Topmost Layer 112

The topmost layer participates in printing and provides the requisite lithographic affinity difference with respect to substrate 102 and/or intermediate layer 104. In addition, the topmost layer may help to control the imaging process by modifying the heat dissipation characteristics of the printing member at the air-imaging layer interface. Negative-working printing members may include a hydrophilic protective layer disposed over the topmost layer 112 to protect the surface of the imaging layer against contamination due to exposure to air and damage during plate handling. The topmost layer remains bonded to the imaging layer and interacts with the water component of the fountain solution as the non-image surfaces of the lithographic printing member.

Suitable materials for topmost layers according to the invention include hydrophilic polymers, such as polyalkyl ethers, polyhydroxyl compounds, and polycarboxylic acids, or oleo. For example, a hydrophilic topmost layer may include a fully hydrolyzed polyvinyl alcohol (e.g., Celvol 305, 325 and 425 sold by Celanese Chemicals, Ltd. Dallas, Tex.), which are usually manufactured by hydrolysis of polyvinyl acetates. The use of fully hydrolyzed alcohol is preferred to assure that residual non-hydrolyzed acetate does not affect the hydrophilic behavior of the surface. The presence of residual polyvinyl acetate moieties in the topmost layer promotes interaction of the non-image areas of the printing member with printing inks, which can diminish print quality.

Topmost layers are typically applied between 0.05 and 1 $g/m^2$ using coating techniques known in the art, such as wire-wound rod coating, reverse roll coating, gravure coating, or slot die coating. For example, in particular embodiments, the topmost layer is applied using a wire-round rod, followed by drying in a convection oven. In a preferred embodiment, the topmost layer is applied between 0.2 and 0.5 $g/m^2$ in order to avoid any deleterious impact on the process-free nature of the printing member.

The topmost layer can also include hydrophilic plasma polymer films deposited by vacuum coating techniques, as discussed above. Such topmost layers may also be applied by plasma polymerization of gas mixtures that produce polymer films with polar functional groups. For example, a topmost layer may applied using plasmas of reactive gas mixtures (e.g., oxygen, carbon dioxide, nitrogen, and/or nitrogen oxide mixed with hydrocarbon gases), or using hydrocarbons containing oxygen functional groups.

The durability of the topmost layer is preferably enhanced by the use of an inorganic crosslinker, e.g., ammonium zirconium carbonate. In order to ensure a high degree of crosslinking (and thus, a high resistance to water), high concentrations (e.g., 10-20%) of the crosslinker are preferred. A suitable crosslinker is Bacote 20, sold by MEL Chemicals, Manchester, UK. The exposed top surface of the crosslinked topmost layer preferably contains little or no residual inorganic crosslinker, such that the topmost layer remains hydrophilic. The use of an inorganic crosslinker rather than an organic crosslinker (e.g., aldehyde) lessens or eliminates VOC emission due to thermal decomposition during the imaging process.

The crosslinked topmost layer is not water-soluble, and thus is not fully removed during printing runs. As such, the topmost layer contributes to the mechanical stability of the printing member, enabling the use of an imaging layer comprising a high percentage of metal or consisting essentially of metal. A high ceramic content in the imaging layer, normally required to maximize mechanical stability, is thus not required. Moreover, in various embodiments, transition layer 104, normally present to contribute mechanical stability, is not required in the printing member. In contrast, existing topmost layers without inorganic crosslinkers display only limited water resistance and are unsuitable for use on printing members not incorporating ceramic imaging layers.

In preferred embodiments, the durability and surface lubricity of the topmost layer is improved by the incorporation of a surfactant. In negative-working embodiments, which feature a hydrophilic topmost layer 112, the surfactant is preferably a silicone compound having polar substituents, e.g., polyether-modified polydimethylsiloxane. A high concentration (e.g., approximately 5% to approximately 25% of the solid components of the topmost layer) of the surfactant is generally added to the topmost layer formulation in order to ensure adequate lubrication during use. In a specific embodiment, the concentration of the surfactant is approximately 10%. The high concentration of the surfactant ensures that an adequate amount of the surfactant will appear at the exposed surface of the topmost layer 112, and the polar moieties prevent the surfactant from adversely affecting the hydrophilicity of the layer. If the concentration of surfactant is too low (e.g., less than approximately 4-5%), the molecules thereof at the exposed surface of the topmost layer may be easily removed by immersion in water and/or mechanical wiping of the surface.

For negative-working printing members, suitable surfactants are compatible with water in addition to providing enhanced surface lubricity to the topmost layer. For silicone surfactants modified with polyether chains, water compatibility is facilitated by a high percentage (e.g., approximately 55% to approximately 70%) of ethylene oxide (EO) groups relative to propylene oxide (PO) groups in the polyether chain of the surfactant molecule. Enhanced surface lubricity is facilitated by the presence of relatively long methylsiloxane chains, e.g., such that the total molecular weight of the surfactant is approximately 2,000 to approximately 30,000 g/mol. Specific surfactants compatible with various embodiments of the invention include BYK 303, BYK 207, and BYK 333, all sold by BYK-Chemie GmbH, Wesel, Germany. The preferred surfactants are silicone polyethers with a water-insoluble silicone backbone, and a number of water-soluble polyether groups in a multi-pendant distribution or rake structure:

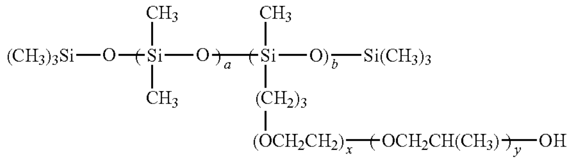

The chemical structure of a suitable surfactant may reflect a compromise among various factors. The topmost hydrophilic layer is desirably disposed on the imaging layer using a low-VOC aqueous coating process. Therefore, the surfactant should exhibit good water compatibility to avoid complete separation during the coating process. This property depends largely on the molecular weight of the surfactant, but also can be tailored by altering the polarity of the surfactant molecule. A polyether chain, for example, includes hydrophilic EO groups and hydrophobic PO chains. The polarity of the silicone surfactant, and thus the water compatibility, is largely determined by the EO/PO ratio in the molecule; in particular, water-compatible silicone-based surfactants have a relatively high proportion of EO. Preferred molecular structures have a total percentage of EO-PO chains of 50% to 70% percent, of which 53% to 55% is preferably hydrophilic EO. Excesive EO content can render the surfactant too soluble, which can reduce the driving force to bring it to the surface of the dry coating during the drying step. For lubrication, on the other hand, adequate performance can be obtained with a relatively large number of dimethylsiloxy segments, although a minimum number of dimethylsiloxane units is required to get the slip effect at the surface of the coating. Therefore, relatively long siloxane chains (i.e., high molecular weights) are desirable; such chains also advantageously enhance migration to the surface of the final coating during drying. In general, the surface slip effect increases, while water compatibility and wetting decrease, as a function of molecular weight. Suitable surfactants are straightforwardly selected without undue experimentation to obtain the desired combination of slip and water interaction.

The topmost layer formulation (i.e., including the inorganic crosslinker and surfactant) is preferably dried and cured at a relatively high temperature, e.g., approximately 350° F. to approximately 375° F. (or approximately 160° C. to approximately 190° C.), in order to ensure approximately complete crosslinking. Moreover, at the high curing temperature, the polyether-modified silicone surfactant molecules become an integral part of the topmost layer (the polyether chains oxidize at temperatures of 140° C.-150° C. or 280° F.-300° F.), and resist detachment in a commercial printing environment. Such detachment would reduce surface lubricity. Without wishing to be bound by any particular theory or mechanism, it is theorized that, at high curing temperatures, the methoxy groups of the surfactant are oxidized and become sites reactive with the remaining (e.g., polyvinyl alcohol) matrix.

3. Imaging Techniques

Figure 4:
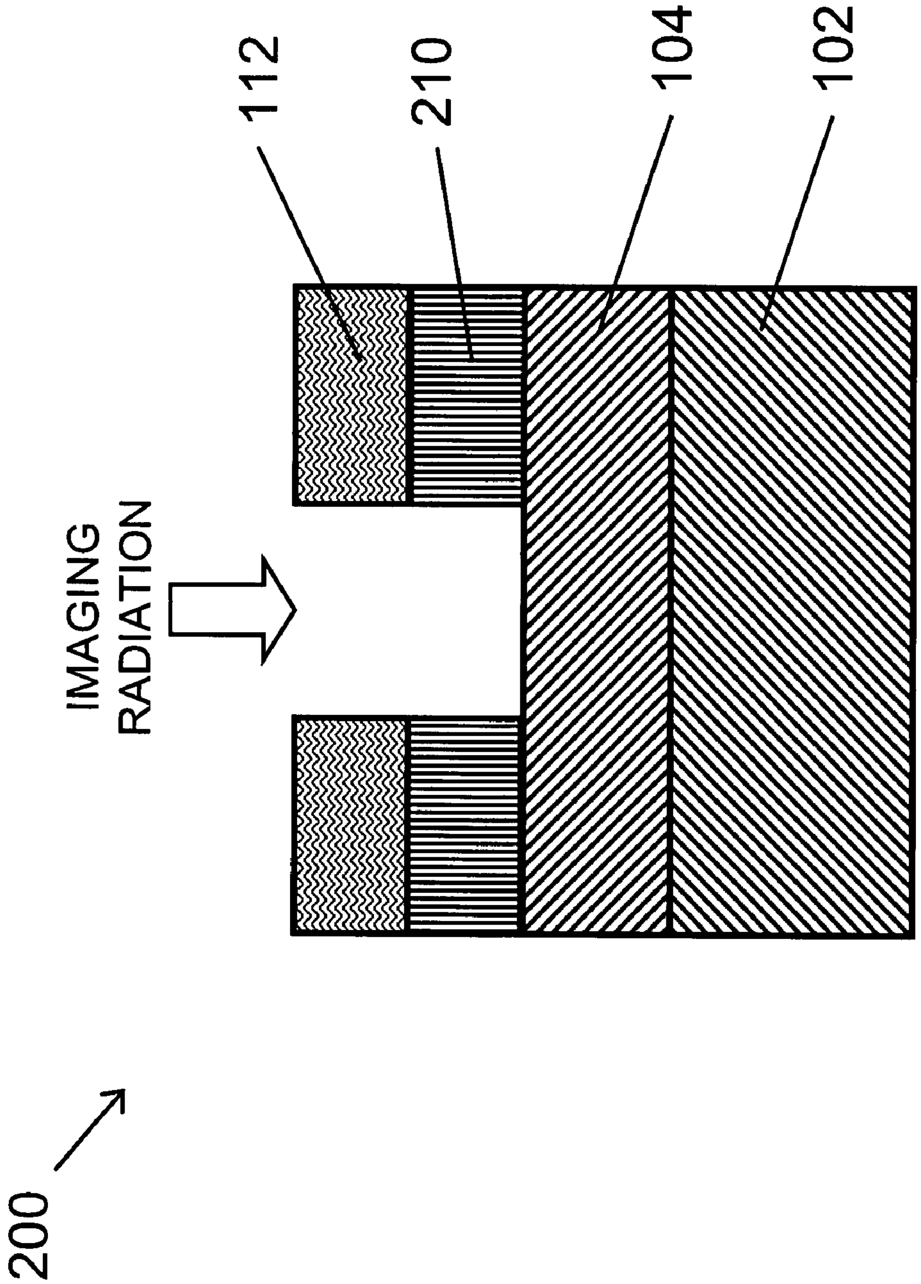
FIG. 4 illustrates the effect of imaging the printing member illustrated in FIG. 2.

FIG. 4 shows the consequences of imaging the printing member illustrated in FIG. 2. The printing member may include a substrate, a hard-coat transition layer, a hydrophilic (e.g., TiC and/or titanium) imaging layer, and a hydrophilic topmost layer. As illustrated in FIG. 4, the exposed area of the imaging layer 210 of this plate absorbs the imaging pulse and converts it to heat. The heat diffuses through the imaging layer 210 until it reaches the interface between the imaging layer 210 and the transition layer 104 (or substrate 102). The transition layer 104 and the substrate 102 (if polymeric) generally do not conduct heat as well as the imaging layer, so the heat from the imaging layer 210 builds up at the interface until the imaging layer 210 ablates, i.e., undergoes either rapid phase transformation (e.g., vaporization) or catastrophic thermal overload. This process is mainly attributed to the contribution of an explosive mechanism generated in the image areas of the plate by exposure to laser radiation. The utilization of imaging layers with a high metal content (or consisting essentially of metal) can reduce the amount of energy necessary to image printing members according to the invention, thus increasing the efficiency of printing processes utilizing such printing members.

After imaging, the topmost layer 112 and the imaging layer 210 are degraded and/or de-anchored in the areas that received imaging radiation. The exposed areas that contain ablation debris are either purged of the debris prior to printing or during print "make ready," or the material of imaging layer 210 is chosen such that debris that remains has an opposite lithographic affinity relative to the topmost layer 112. In general, the printing member can be used on press immediately after being imaged without the need for a post-imaging processing step.

Printing with the printing member includes disposing ink on at least a portion of the printing member, preferably the oleophilic exposed areas. The ink is transferred in the imagewise lithographic pattern (created as described above) to a recording medium such as paper. The inking and transferring steps may be repeated a desired number of times, e.g., the approximately 5,000 to approximately 20,000 times in a low to medium printing run.

After repeated exposure to printing fluids, any remaining ablation debris may be carried away from the printing member; at this point, the transition layer (or, in the absence of a transition layer, the substrate) provides the necessary lithographic surface. Preferably, at least a substantial portion of the topmost layer 112 is not removed by exposure to the printing fluids.

Although the present invention has been described with reference to specific details, it is not intended that such details should be regarded as limitations upon the scope of the invention, except as and to the extent that they are included in the accompanying claims.

What is claimed is:

1. A lithographic printing member capable of recording an image defined by regions exhibiting differential affinities for ink and/or fountain solution, the printing member comprising:

a water-insoluble hydrophilic topmost layer having a thickness and a surface, and comprising a cross-linked hydrophilic polymer that resists degradation by aqueous printing fluids and a silicone surfactant, the surfactant being present throughout the topmost layer and at the surface thereof;

an imaging layer that ablatively absorbs imaging radiation and to which the topmost layer is bonded, ablative absorption of radiation by the imaging layer de-anchoring the topmost layer wherein the imaging layer comprises at least one ceramic layer and at least metal layer; and an oleophilic layer beneath the imaging and topmost layers, the topmost layer being capable of adsorbing an aqueous liquid to resist application of ink and the oleophilic layer being capable of receiving and transferring ink.

2. The lithographic printing member of claim 1, wherein the silicone surfactant is present at an exposed surface of the topmost layer at a level.

3. The lithographic printing member of claim 1, wherein the imaging layer comprises a metal.

4. The lithographic printing member of claim 3, wherein the metal comprises titanium.

5. The lithographic printing member of claim 1, wherein the topmost layer comprises an inorganic crosslinker.

6. The lithographic printing member of claim 5, wherein the inorganic crosslinker comprises ammonium zirconium carbonate.

7. The lithographic printing member of claim 5, wherein a concentration of the inorganic crosslinker ranges from approximately 10% to approximately 20%.

8. The lithographic printing member of claim 5, wherein a top surface of the topmost layer is substantially free of the inorganic crosslinker.

9. The lithographic printing member of claim 1, wherein at least a portion of the silicone surfactant is bound to the polymer of the topmost layer.

10. A lithographic printing member capable of recording an image defined by regions exhibiting differential affinities for ink and/or fountain solution, the printing member comprising:

a water-insoluble hydrophilic topmost layer having a thickness and a surface, and comprising a cross-linked hydrophilic polymer that resists degradation by aqueous printing fluids and a silicone surfactant, the surfactant being present through the thickness of the topmost layer and at the surface thereof;

an imaging layer that ablatively absorbs imaging radiation and to which the topmost layer is bonded, ablative absorption of radiation by the imaging layer de-anchoring the topmost layer; and a oleophilic layer beneath the imaging and topmost layers, wherein (i) a concentration of the silicone surfactant ranges from approximately 10% to approximately 25%, the topmost layer is capable of adsorbing an aqueous liquid to resist application of ink, and (iii) the oleophilic layer is capable of receiving and transferring ink.

11. The lithographic printing member of claim 9, wherein a molecular weight of the silicone surfactant ranges from approximately 2,000 to approximately 30,000 g/mol.

12. The lithographic printing member of claim 10, wherein the silicone surfactant comprises polar groups.

13. The lithographic printing member of claim 12, wherein the silicone surfactant comprises polyether-modified polydimethylsiloxane.

14. The lithographic printing member of claim 10, wherein the oleophilic layer comprises a polymer.

15. The lithographic printing member of claim 14, wherein the oleophilic layer is a transition layer, the lithographic printing member further comprising a substrate disposed below and in contact with the transition layer.

16. A method of imaging a lithographic printing member capable of recording an image defined by regions exhibiting differential affinities for ink and/or fountain solution, the method comprising the steps of:

(a) providing a printing member having a water-insoluble hydrophilic topmost layer having a thickness and a surface, an imaging layer, and a oleophilic layer therebeneath, wherein (i) the imaging layer absorbs imaging radiation, (ii) the topmost layer comprises a cross-linked hydrophilic polymer that resists degradation by aqueous printing fluids and a silicone surfactant present throughout the thickness of the topmost layer, and (iii) the topmost layer and the oleophilic layer exhibit opposite affinities for at least one of ink or a liquid to which ink does not adhere;

(b) exposing the printing member to imaging radiation in an imagewise pattern so as ablate at least a portion of the imaging layer exposed to the imaging radiation; and (c) removing at least the imaging layer where the lithographic printing member received radiation, the topmost layer remaining bonded to unremoved portions of the imaging layer, thereby creating an imagewise lithographic pattern on the printing member.

17. The method of claim 16, further comprising:

(d) disposing ink on at least a portion of the printing member; and (e) transferring the ink in the imagewise lithographic pattern to a recording medium; and (f) repeating steps (d) and (e) a plurality of times, wherein at least a portion of the silicone surfactant remains on an exposed surface of the topmost layer.

18. The method of claim 17, wherein the plurality of times ranges from approximately 5,000 to approximately 20,000 times.

19. The method of claim 16, wherein the silicone surfactant is present at an exposed surface of the topmost layer.

20. The method of claim 16, wherein a concentration of the silicone surfactant ranges from approximately 5% to approximately 25%.

21. The method of claim 16, wherein a molecular weight of the silicone surfactant ranges from approximately 2,000 to approximately 30,000 g/mol.

* * * * *